United States Patent
Rivoir et al.

(10) Patent No.: US 7,414,558 B2
(45) Date of Patent: Aug. 19, 2008

(54) DIGITAL TO ANALOG CONVERSION USING SUMMATION OF MULTIPLE DACS

(75) Inventors: Jochen Rivoir, Magstadt (DE); Holger Engelhard, Nufringen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/489,431

(22) Filed: Jul. 19, 2006

(65) Prior Publication Data

US 2007/0024482 A1 Feb. 1, 2007

(30) Foreign Application Priority Data

Jul. 27, 2005 (EP) ................................. 05106931

(51) Int. Cl.
*H03M 1/66* (2006.01)
(52) U.S. Cl. ...................................... 341/144; 341/118
(58) Field of Classification Search ................ 341/144, 341/145, 143, 120, 118
See application file for complete search history.

(56) References Cited

U.S. PATENT DOCUMENTS

| | | | | |
|---|---|---|---|---|
| 5,017,919 | A | * | 5/1991 | Hull et al. .................... 341/136 |
| 5,323,157 | A | | 6/1994 | Ledzius et al. |
| 5,703,587 | A | * | 12/1997 | Clark et al. ................. 341/144 |
| 5,760,726 | A | | 6/1998 | Koifman et al. |
| 5,995,030 | A | | 11/1999 | Cabler |
| 6,072,415 | A | * | 6/2000 | Cheng ........................ 341/144 |
| 6,104,968 | A | * | 8/2000 | Ananth ........................ 700/297 |
| 6,154,160 | A | * | 11/2000 | Meyer et al. ................. 341/139 |
| 6,177,896 | B1 | | 1/2001 | Min |
| 6,348,884 | B1 | | 2/2002 | Steensgaard-Madsen |
| 6,424,278 | B1 | | 7/2002 | Groeneweg |
| 6,469,988 | B1 | | 10/2002 | Yang et al. |
| 6,650,265 | B1 | * | 11/2003 | Bugeja ........................ 341/144 |
| 6,697,004 | B1 | * | 2/2004 | Galton et al. ................ 341/144 |
| 7,030,799 | B2 | * | 4/2006 | Lee et al. ..................... 341/144 |
| 2002/0190884 | A1 | | 12/2002 | Yu |
| 2004/0207462 | A1 | | 10/2004 | Jaussi et al. |
| 2005/0015419 | A1 | | 1/2005 | Pu et al. |

(Continued)

FOREIGN PATENT DOCUMENTS

EP 0 281 116 3/1988

(Continued)

OTHER PUBLICATIONS

Steensgaard, Jesper, "High-Resolution Mismatch-Shaping Digital-To-Analog Converters", Proceedings of the 2001 IEEE International Symposium on Circuits and Systems, Sydney, Australia, 2001, vol. 1 of 5, pp. 516-519.

(Continued)

*Primary Examiner*—Peguy JeanPierre (57) ABSTRACT

A method for converting a digital signal to an analog signal, said method including a plurality of signal sources, preferably current sources, one or more of said signal sources being variable output signal magnitude sources, said method including the steps of setting the output signal magnitudes of the one or more variable output signal magnitude sources by individual setting signals being input signals for said respective variable output signal magnitude sources, wherein said conversion is adaptable on a per signal basis in response to needs concerning bandwidth and/or accuracy for achieving a trade-off between sample-rate and resolution of said conversion.

15 Claims, 4 Drawing Sheets

U.S. PATENT DOCUMENTS

2005/0040979 A1    2/2005    Brooks et al.

FOREIGN PATENT DOCUMENTS

WO        WO 02/13392      2/2002

OTHER PUBLICATIONS

Rudberg, Mikael, et al., "Glitch Minimization and Dynamic Element Matching in D/A Converters", Electronics, Circuits and Systems, vol. 2, 2000, pp. 899-902.

Mercer, Douglas, "A Study Of Error Sources in Current Steering Digital-To-Analog Converters", Custom Integrated Circuits Conference, 2004, pp. 185-190.

Van Den Bosch, A., et al., "SFDR-Bandwidth Limitations for High Speed High Resolution Current Steering CMOS D/A Converters", Electronics, Circuits and Systems, 1999, vol. 3, pp. 1193-1196.

Maloberti, f., et al., "Multibit Oversampled DAC With Dynamic Matching Of Current Sources", Analogue to Digital to Analogue Conversion, 1991, pp. 130-135.

Aga, Arshan, et al., "A CMOS Digitally Programmable Current Steering Semidigital Fir Reconstruction Filter", Proceedings of the 2001 IEEE International Symposium on Circuits and Systems, Sydney, Australia, 2001, vol. 1 of 5, pp. 168-171.

European Search Report Dated Sep. 23, 2005.

* cited by examiner

| Param | Possible values | Verbal description | Formal description |
|---|---|---|---|
| $N_D$ | 8, 16, 24, 32, 64 | Number of outputs of demultiplexer (deserializer) | $D = D[0..(N_D-1)]$ |
| $N_M$ | 0..6, 24 | Number of passed MSB bits, rest are zero | $M[0..(N_M-1)] = D[0..(N_M-1)]; M[N_M..5] = 0$ |
| $N_L$ | 0..64 | Number of passed LSB bits, rest are zero | $L[(63-N_L+1)..63] = D[(63-N_L+1)..63]; L[0..(63-N_L)] = 0$ |
| $N_C$ | 2,3,5,9,17,33,64 | Number of codes of DSM, TMC, and DEM | $0 \le C \le (N_C-1); T[0..(N_C-1)] \ne 0; T[N_C..63] = 0$ |
| $N_B$ | 0..63 | Number of shifted bit positions | $B[N_B..63] = L[0..(63-N_B)]; B[0..(N_B-1)] = 0$ |
| $N_S$ | 0,1,2,4,8,16,32,64 | Select $N_S$ MSB bits from L, rest from B | $F[0..(N_S-1)] = T[0..(N_S-1)]; F[N_S..63] = B[N_S..63]$ |
| $N_F$ | 1,2,4,8,16,32,64 | Number of used FIR filter inputs | Filter order = $N/N_F-1 = 64/N_F-1$ |

DIGITAL TO ANALOG CONVERSION USING SUMMATION OF MULTIPLE DACS

BACKGROUND

The present invention relates to converting a digital signal to an analog signal.

Digital to analog conversion is widely applied in electronic signal processing. Known conversion techniques use so-called current steering Nyquist digital to analog converters (DAC) summing binary weighted current sources to form the analog signal. Such Nyquist DACs offer high-speed conversion with relatively few current sources. The output analog signal shows inaccuracy due to mismatch of the weighted current sources, in particular with large current range. To minimize such mismatch requires a difficult layout. Furthermore a hardware filter is necessary, e.g. a low pass filter, for filtering the output signal to suppress harmonic content in the output signal.

Another known conversion technique uses a so-called multi-bit Delta-Sigma converter summing only equal current sources and thus offering high accuracy at reduced conversion speed due to over-sampling. A subset of n out of in total N equal current sources can be selected using a dynamic element matching (DEM) unit by randomly selecting a subset of equal current sources to further improve accuracy by averaging out mismatch errors of the individual equal current sources. The mismatch error is converted into noise. A hardware filter is still necessary for filtering the output signal.

Another known conversion technique uses so-called segmented NYQUIST DAC wherein a number of M most significant bits (MSB) are processed to $2^M$ equal current sources and a number of L least significant bits (LSB) are processed to L binary weighted current sources. In an output stage the outputs of the $2^M$ equal current sources and the L binary weighted sources are summed. Such segmented NYQUIST DACs offer a reduction of the current range of the weighted current sources used for the LSB. For the MSB a subset of equal current sources can be selected using a dynamic element matching (DEM) unit by randomly selecting a subset of equal current sources to further improve accuracy by averaging out mismatch errors of the individual equal current sources. The mismatch error is converted into noise. A hardware filter is still necessary for filtering the output signal.

SUMMARY OF THE DISCLOSED EMBODIMENTS

It is an object of the invention to provide improved digital to analog conversion. The object is solved by the independent claims. Further embodiments are shown by the dependent claims.

According to embodiments of the present invention, at least one variable output signal magnitude source, e.g. variable current source or variable voltage source is used for an output unit of the digital to analog converter. Usually a digital to analog converter (DAC) comprises an output stage having voltage or current sources, which are of either fixed binary weighted magnitude or of equal magnitude and which are switched ON or OFF depending upon the value of the digital signal to be converted. In an embodiment of the present invention, the respective magnitudes of the voltage or current sources are settable by a setting signal, e.g. by a setting signal being individual for each voltage or current source, thus the contribution of the voltage or current sources to the analog signal can be precisely adjusted. Thus the magnitude of the individual sources can be chosen most suitable for the digital signal to be converted. Additionally this type of sources allows to compensate mismatches of output signals of the various signal sources.

The output of at least some, preferably all, variable output magnitude signal sources are summed to contribute to said analog signal. If only one variable output magnitude signal source is used, the output of said one variable output magnitude signal source is forwarded to contribute to said analog signal. In addition to said at least one variable output magnitude signal source also other types of signal sources, e.g. equal output magnitude signal sources, may contribute to said analog signal, e.g. can be summed.

In an embodiment the setting signal is a digital signal. Thus the voltage or current sources can individually be realized by digital to analog converter units forming the output stage of the overall DAC. In consequence, the overall DAC comprises numerous digital to analog converter units within the output stage of the overall DAC.

In an embodiment the setting of the signal sources are performed by static setting signals being independent from the individual digital signal to be converted. But the setting signals can be selected dependent from an operation mode of the inventive DAC. Moreover the setting signals allow for realizing binary weighted output magnitude sources, or equal output magnitude sources, or a combination of both. In an embodiment the settings are software controlled and thus programmable leading to flexible selection of operation modes and adaptation to conversion needs.

In an embodiment the conversion is adaptable on a per signal basis, i.e. on the base of an analysis of the signal to be converted and/or requirements of the signal to be generated. In addition to the settings concerning the output stage as described above, additional settings are available to choose or combine different converter types including NYQUIST DACs or over-sampling DACs. Adaptation on a per signal basis includes variation of the settings for each individual data stream present at the input of the inventive DAC.

In an embodiment at least some variable output signal magnitude sources are combined with a corresponding switching element. In another embodiment each variable output signal magnitude source is combined with a corresponding switching element. The respective switching element determines whether the corresponding signal source contributes to the analog signal at the output of the inventive DAC or not.

The switching element can be realized as a changeover switch. If the corresponding signal source is not to contribute to the analog signal, then the changeover switch allows for a flow of the output signal of the signal source to a dummy load and thus provides continuous loading and stable behavior of the signal source. Furthermore settling time for reaching a valid signal is reduced. In addition, during non-contributing, the output of the signal source may be measured and thus the signal source may be checked for proper operation. If any problem occurs, e.g. a deviation of the output magnitude, the signal source can be readjusted by a change to the setting signal. Furthermore, if necessary, the signal source can be totally deactivated, and replaced by another, so far unused, signal source. In an embodiment, such replacement is controlled by software and thus programmable.

In an embodiment at least some of the signal sources are part of a filter element, in particular a finite impulse response (FIR) filter element. Said filter element comprising a logic unit. Said logic unit may provide also switch control signals for controlling the switching elements.

In an embodiment said filter is software programmable, e.g. the filter order and/or the transfer function of the filter is software programmable. The filter may realize a semi-digital FIR filter. In an embodiment the values of the filter coefficients are determined by said setting signals of said signal sources. The normalized value of said filter coefficients can range from −1 to 1, wherein at least one intermediate value can be set by a corresponding setting signal. Especially due to this high flexibility of the filter coefficients embodiments of the inventions may be used for reconstruction purposes or noise reduction.

In an embodiment the FIR filter chain is broken into sub-chains or delay elements and the inputs of the FIR filter are enumerated. An optimization of resolution, accuracy, bandwidth and speed is achieved by adapting the inventive conversion on a per signal basis. The digital content is maximized to allow process portability and/or performance scalability.

In an embodiment the converter is a binary weighted NYQUIST DAC where binary weights are accurately set by high-resolution DACs in the output stage of the binary weighted NYQUIST DAC. In another embodiment the converter is a segmented NYQUIST DAC where a mix of binary weights and equal weights are accurately set by high-resolution DACs in the output stage of the segmented NYQUIST DAC. In another embodiment the converter is a multi-bit over-sampling DAC where equal weights are accurately set by high-resolution DACs in the output stage of the multi-bit over-sampling DAC. In another embodiment the converter is a DAC, e.g. a multi-bit DAC, followed by a semi-digital FIR filter, where filter coefficients are set by DACs in the output stage of the multi-bit DAC.

In an embodiment the change of DAC values in combination with flexible DAC selection logic enables software selectable DAC modes and/or software programmable degree and transfer function of semi-digital FIR filter. E.g. the trade-off between resolution and bandwidth is software programmable by selection the number of bits versus the filter order. In addition or as an alternative, the number of bits in binary weighted DAC or in segmented DAC, or in multi-bit delta-sigma DAC is software programmable. In addition or as an alternative, the number of DEM bits versus binary bits in segmented DAC is software programmable.

Embodiments of the invention can be partly or entirely embodied or supported by one or more suitable software programs, which can be stored on or otherwise provided by any kind of data carrier, and which might be executed in or by any suitable data processing unit. In an embodiment software programs or routines are applied to control the output signal magnitude of at least some of said variable output signal magnitude sources. In an embodiment software programs or routines are applied to flexibly select modes of the overall DAC operation and/or of the transfer function of the filter to enable software programmable trade-off between resolution, bandwidth and filter effectiveness.

BRIEF DESCRIPTION OF DRAWINGS

Other objects and many of the attendant advantages of embodiments of the present invention will be readily appreciated and become better understood by reference to the following more detailed description of embodiments in connection with the accompanied drawing(s). Features that are substantially or functionally equal or similar will be referred to by the same reference sign(s).

DETAILED DESCRIPTION OF THE DISCLOSED EMBODIMENTS

Figure 1:
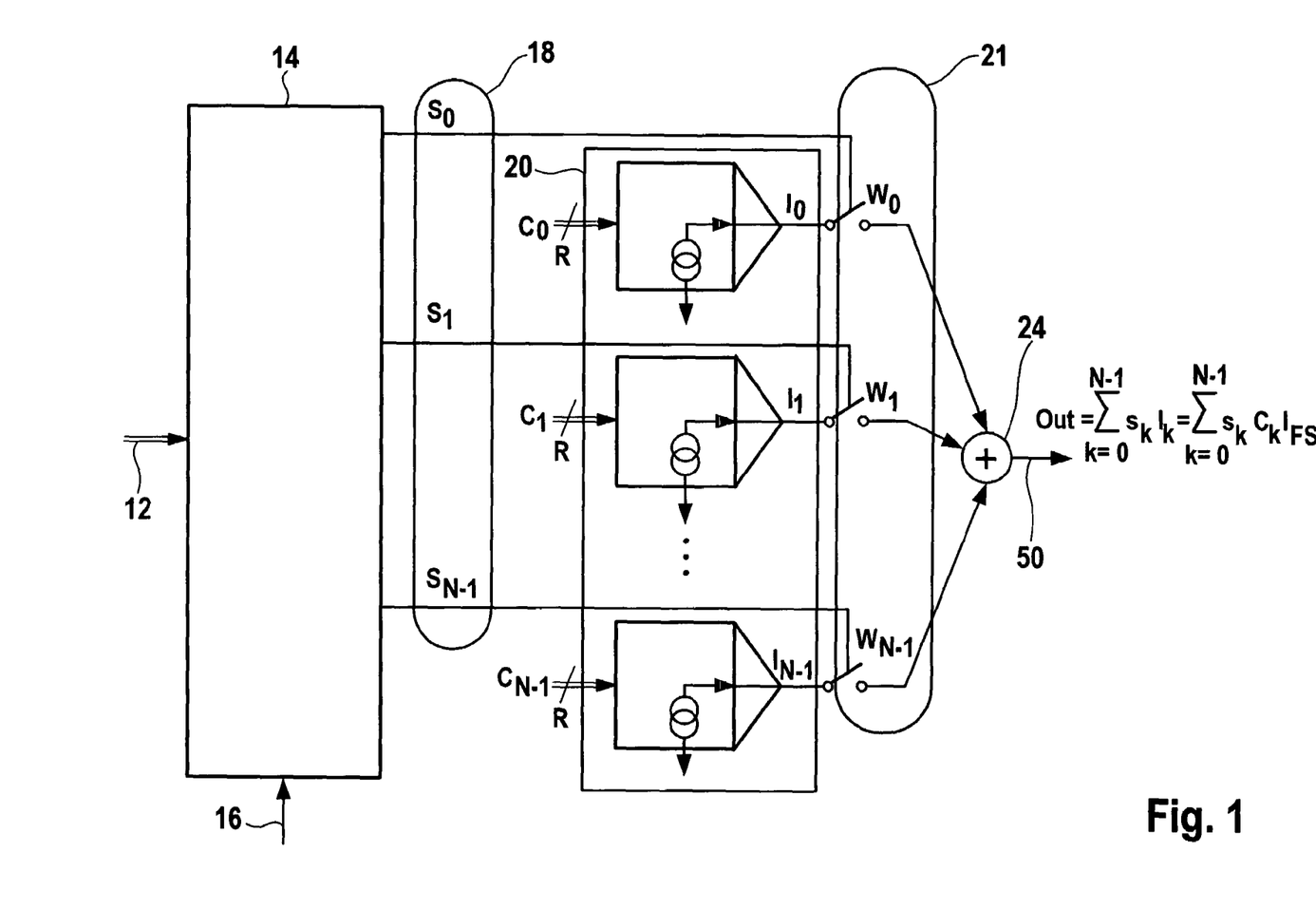
FIG. 1 shows a block diagram representing the general idea of the invention.

FIG. 1 shows a block diagram representing the general idea of the invention. A data stream 12 representing the digital signal to be converted is fed to a flexible DAC selection unit 14. The flexible DAC selection unit 14 being controlled by settings 16 being static during a conversion cycle, said static settings being adapted to said data stream and/or said trade-off between accuracy and bandwidth. The flexible DAC selection unit 14 provides N output signals $18 \, S_0, S_1, \ldots, S_{N-1}$ to control N variable output signal magnitude sources 20. E.g. the N output signals $18 \, S_0, S_1, \ldots, S_{N-1}$ control N switching elements $21 \, W_0, W_1, \ldots, W_{N-1}$, each of which being situated between the output of a corresponding signal source 20 and an adder 24 summing the output of the N signal sources 20 to form said analog signal 50. Thus the analog signal 50 is the sum of all products $s_k I_k$, with k=0 to k=N−1 and $s_k$=0 or 1, wherein $I_k$ represents the output magnitude of variable output signal magnitude source k (k=0, 1, ..., N−1) and equals the product of static DAC setting $C_k$ and full scale current $I_{FS}$ of the variable output signal magnitude source k as shown by the equation in FIG. 1.

The flexible DAC selection unit 14 selects a subset of signal sources 20 to enable software programmable trade-off between resolution, bandwidth and filter effectiveness. In the shown embodiment the settings 16 are software programmable. The data stream 12 can be the digital signal to be converted or a signal derived out of the digital signal to be converted.

Within the flexible DAC selection unit 14 the data stream 12 may be split feeding at least two different signal paths providing different data processing. In a first path the data stream is over-sampled whereas in the second path the data stream remains substantially unchanged. By a software controlled selection, and thus programmable, the output signal of either the first path or of the second path, or of a combination of first and second path output signal, is processed towards said N signal sources 20. More generally the shown embodiment allows to chose or combine from NYQUIST converter, segmented NYQUIST converter, multi-bit delta-sigma converter, over-sampling converter etc. and finite impulse response filter.

Figure 2:
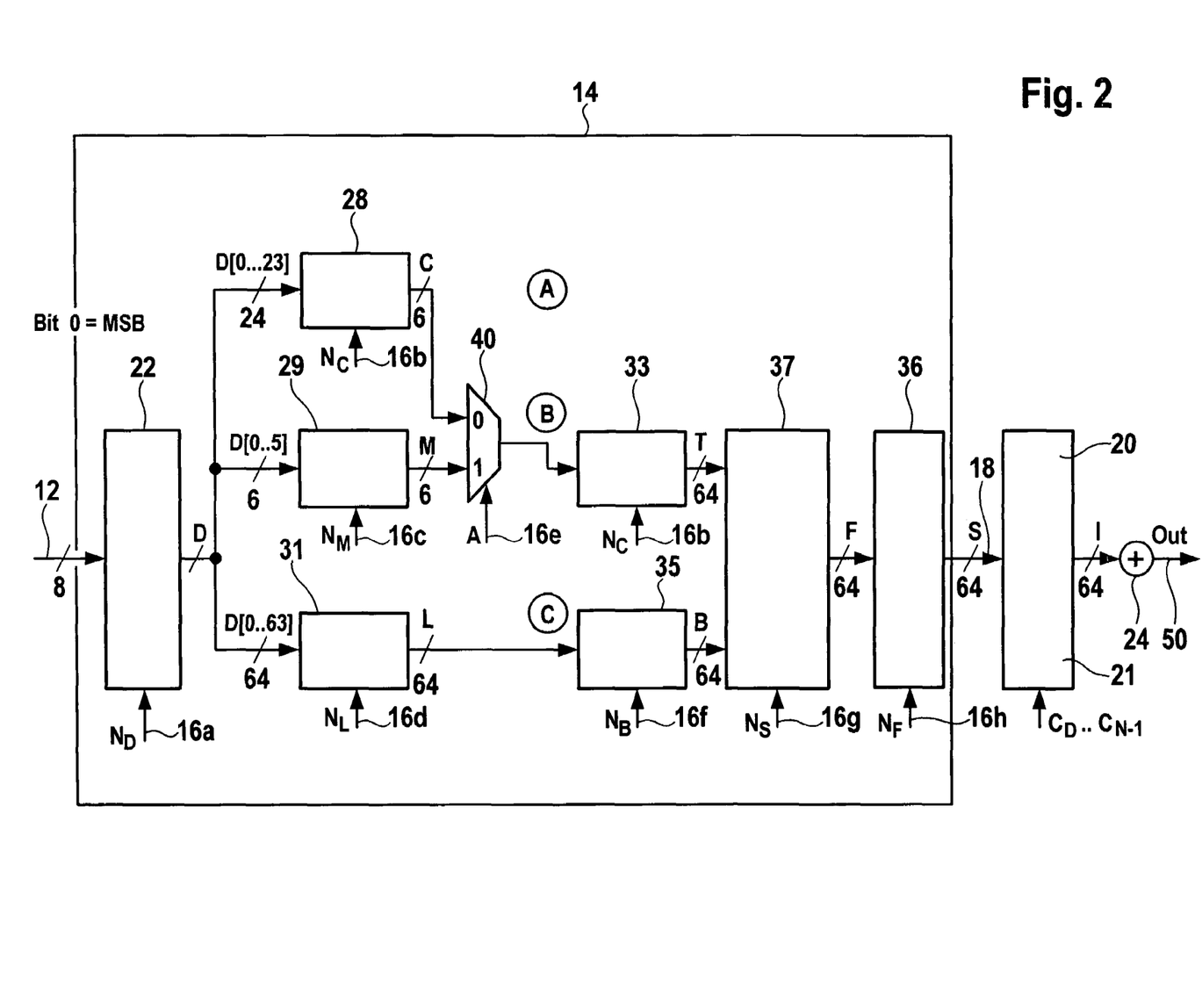
FIG. 2 shows an embodiment of the invention.

FIG. 2 shows an embodiment of the invention. The data stream 12 is formed by an 8-bit wide digital signal. Preferably the data stream 12 is oversampled. The flexible DAC selection unit 14 comprises at its input an word-width adaptation unit 22, which adapts the word-width of the data stream 12 according to a setting signal $16a \, N_D$. Accordingly the word-width adaptation unit 22 has 64 outputs.

The output of the word-width adaptation unit 22 is split into three parts, each of which being provided to the input of one of three following processing units 28, 29, 31. The first following processing unit 28 being a delta-sigma modulator, which is controlled by setting signal $16b \, N_C$. The second following processing unit 29 being a first passing unit for passing a number of most significant bits (MSB), wherein the number of passed MSB is controlled by setting signal $16c \, N_M$. The third following processing unit 31 being a second passing unit for passing a number of least significant bits (LSB), wherein the number of passed LSB is controlled by setting signal $16d \, N_L$.

The output of the first following processing unit 28 and the output of the second following processing unit 29 are input to a first selection unit 40, controlled by setting signal 16e A. The output of the first selection unit 40 is input to a thermometer code encoding unit 33, preferably further comprising a dynamic element matching unit, being controlled by setting signal 16b $N_C$. The output of the third following processing unit 31 is input to a barrel shifter 35 being controlled by setting signal 16f $N_B$.

The outputs of thermometer code encoding unit 33 and barrel shifter 35 are fed to a second selection unit 37 controlled by setting signal 16g $N_S$. The output of second selection unit 37 is fed to a finite impulse response filter logic unit 36 controlled by setting signal 16h $N_F$. The output of finite impulse response filter logic unit 36 corresponds to said N output signals 18 $S_0, S_1, \ldots, S_{N-1}$ shown in FIG. 1 to control N variable output signal magnitude sources 20. The setting signals 16a to 16h shown in FIG. 2 are part of setting signal 16 shown in FIG. 1.

In the following, three modes of operation are described for the structure shown in FIG. 2 according to corresponding setting signals 16a to 16h. These three modes of operation represent only examples out of a larger variety of possible modes of operation. For all three described modes of operation the number of variable output magnitude signal sources 20, e.g. the number of DACs in the output stage of the inventive overall DAC, is 64.

Figure 3:
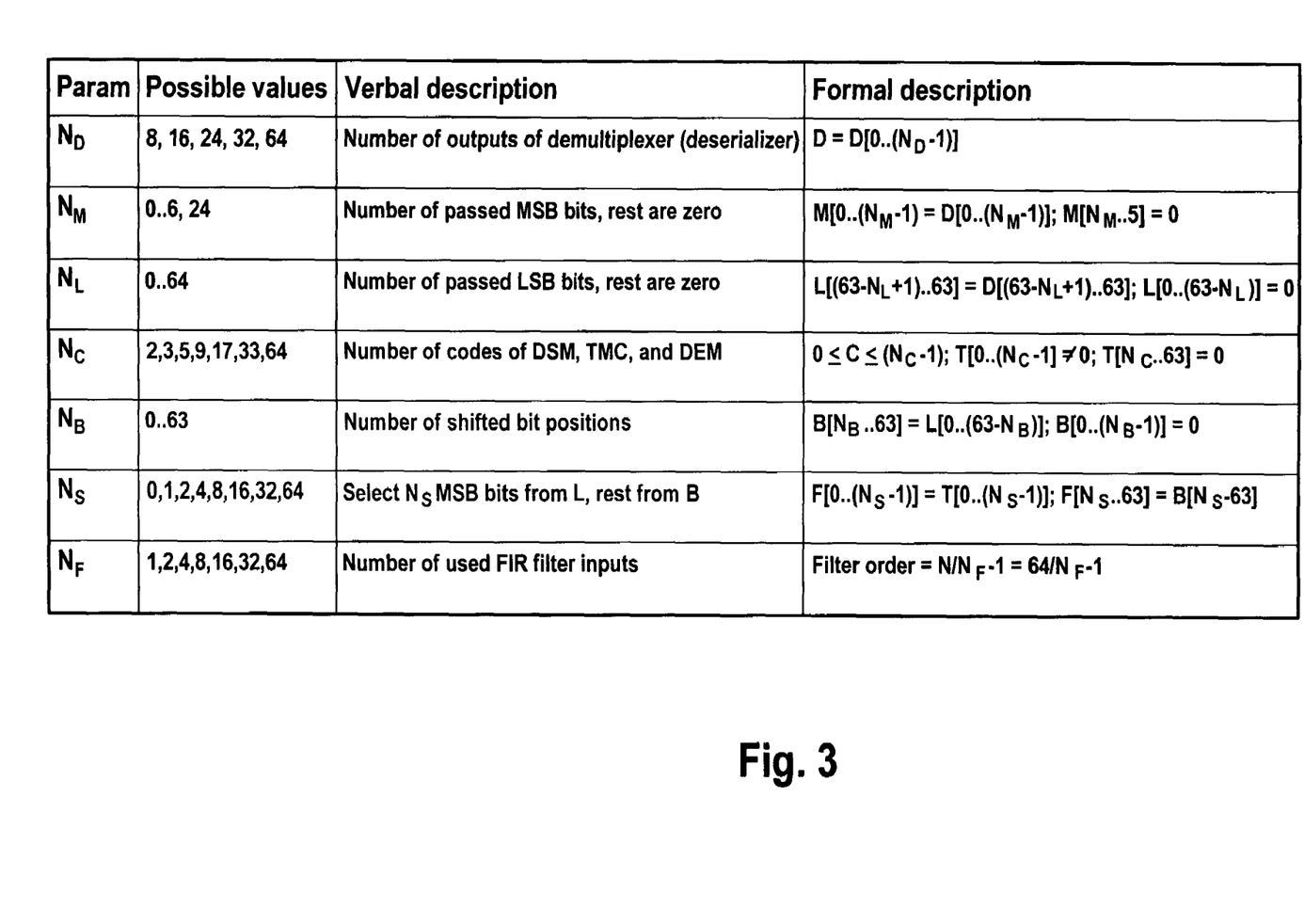
FIG. 3 shows the interdependence of setting signals.

FIG. 3 shows the interdependence of setting signals 16a to 16h accompanied by their possible values, a verbal description of their meaning and a formal description of the resulting parameters of the overall DAC. As shown in more detail below several modes of operation can be realized, e.g. NYQUIST converter, segmented NYQUIST converter, oversampling converter etc., all with optional FIR filter. The programmable DACs can be used to select dynamically between binary weighted currents for NYQUIST converters, or equal currents for over-sampling converters, or a combination for segmented NYQUIST converters with DEM. Further they can be used to calibrate for minimum mismatch and/or to set the FIR filter coefficients. Also a combination of DAC currents and filter coefficients can be programmed.

In a first example mode of operation the following characteristics are wanted: 16 bit binary weighted NYQUIST DAC; third order FIR filter, coefficients $a_0, \ldots, a_3$; 64 DACs in the output stage. The following settings are chosen to realize the wanted characteristics: $N_D=16$; using path C as marked in FIG. 2, processing the data stream 12 via second passing unit 31 and barrel shifter 35 to second selection unit 37; $N_L=64$ (finally use 16 most significant bits MSB); $N_B=0$; $N_S=0$; $N_F=16$; using four sets of 16 binary weights; the setting $C_k$ for the DACs in the output stage are chosen according to the equation: $C_k=a[k/4]\times 2^{-k \bmod 16}$ with k being $0, \ldots, 63$. $C_k$ does not yet include correction factors, e.g. for compensation of mismatches of the sources.

According to the setting values chosen for this first mode of operation and using the formal description shown in the last column in FIG. 3 the number of outputs D of word-width adaptation unit 22 ranges from 0 to 15. The LSB bits L passed by second passing unit 31 L[0 . . . 63] equal bits D [0 . . . 63] present at the input of second passing unit 31, none of the LSB bits is set to zero by second passing unit 31. According to the fifth line of FIG. 3 for the setting value of NB=0, the barrel shifter 35 outputs bits B[0 . . . 63]=L[0 . . . 63], so no bit positions are shifted.

Using DACs allows to correct deviations of the actual output magnitude from the ideal output magnitude of the current sources. Furthermore the first mode of operation allows for trading off the number of bits versus filter order. Furthermore the filter coefficients are programmable and the external filtering effort is reduced.

In a second example mode of operation the following characteristics are wanted: 3+15 bit segmented NYQUIST DAC; first order FIR filter, coefficients $a_0, a_1$; 64 DACs in the output stage. The following settings are chosen to realize the wanted characteristics: $N_D=16$; using path B as marked in FIG. 2, processing the data stream 12 in part via first following processing unit 28 being a delta-sigma modulator and in part via first passing unit 29; $N_M=3$; $N_C=8$; $N_{L=61}$; $N_B=5$; $N_S=8$; $N_F=23$; using the DAC setting $C_k=a_0$ for $k=0, \ldots, 7$; $C^k=a_0\times 2^{-(1 \cdots 15)}$ for $k=8, \ldots, 23$; $C_k$=not used for $k=24, \ldots, 31$; $C_k=a_1$ for $k=32+(0 \ldots 7)$; $C_k=a_1\times 2^{-(1 \cdots 15)}$ for $k=32+(8 \ldots 23)$; $C_k$=not used for $k=32+(24 \ldots 31)$. $C_k$ does not yet include correction factors, e.g. for compensation of mismatches of the sources.

According to the setting values chosen for this second mode of operation the dependent values, e.g. D, C, M, T shown in FIG. 2, can be calculated using the formal description shown in the last column in FIG. 3.

In addition to the advantages of the first mode of operation, the second mode of operation allows for software programming of the number of DEM bits versus number of binary weighted bits.

In a third example mode of operation the following characteristics are wanted: 3 bit multi-bit delta-sigma converter with hardware modulator; seventh order FIR filter, coefficients $a_0$ to $a_7$; 64 DACs in the output stage. The following settings are chosen to realize the wanted characteristics: $N_D=24$; using path A as marked in FIG. 2, processing the data stream 12 only via first following processing unit 28 being a delta-sigma modulator by choosing setting signal 16e A such that only the output of first following processing unit 28 is forwarded to the output of first selection unit 40, i.e. A=0; $N_C=9$; $N_S=8$; $N_F=8$; using eight sets of eight equal weights or values; using the DAC setting $C_k=a_{[k/8]}$ for $k=0, \ldots, 63$.

According to the setting values chosen for this third mode of operation the dependent values, e.g. D, C, T shown in FIG. 2, can be calculated using the formal description shown in the last column in FIG. 3.

In addition to the advantages of the first mode of operation, the third mode of operation allows for software programming of the number of DEM bits. Due to the possibility to correct deviations of the actual output magnitude from the ideal output magnitude of the current sources the mismatch can be greatly reduced to less than 0.1%, e.g. reduced to 0.01%.

Figure 4:
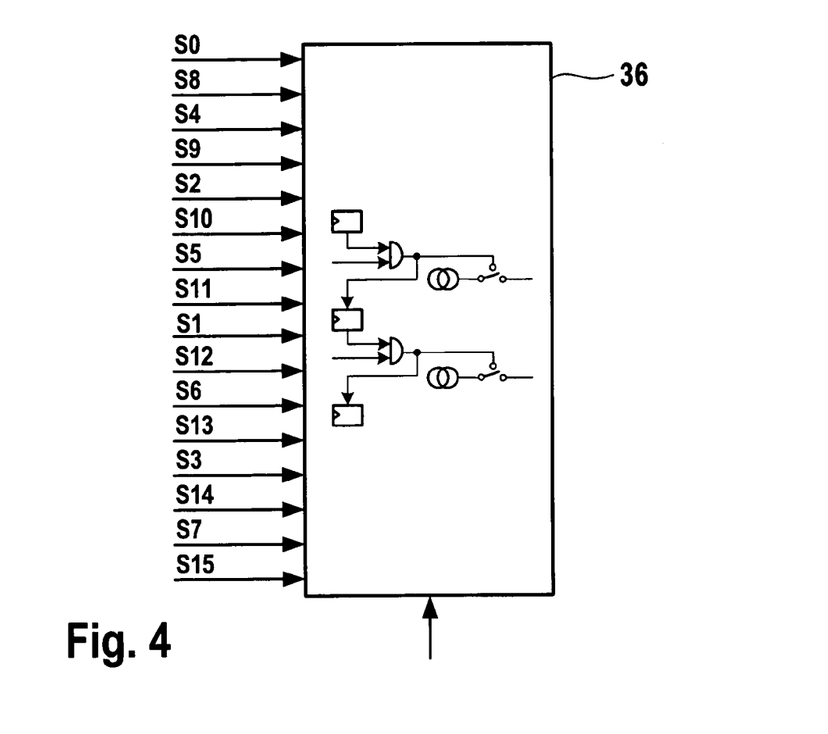
FIG. 4 shows an implementation of finite impulse response filter logic unit.

FIG. 4 shows an implementation of finite impulse response filter logic unit 36 and variable current sources 20, preferably as an integrated circuit. The embodiment shown comprises in total 16 variable current sources, thus allowing filter orders of 1, 2, 4, 8 or 16. Accordingly all 16 input (for filter order of 1) or only 8, 4, 2 inputs are used, or only one input is used, controlled by control signal 16c. The filter order can be programmed by breaking a chain of 16 delay elements, each of which being able to control one of said equal current sources.

Figure 5:
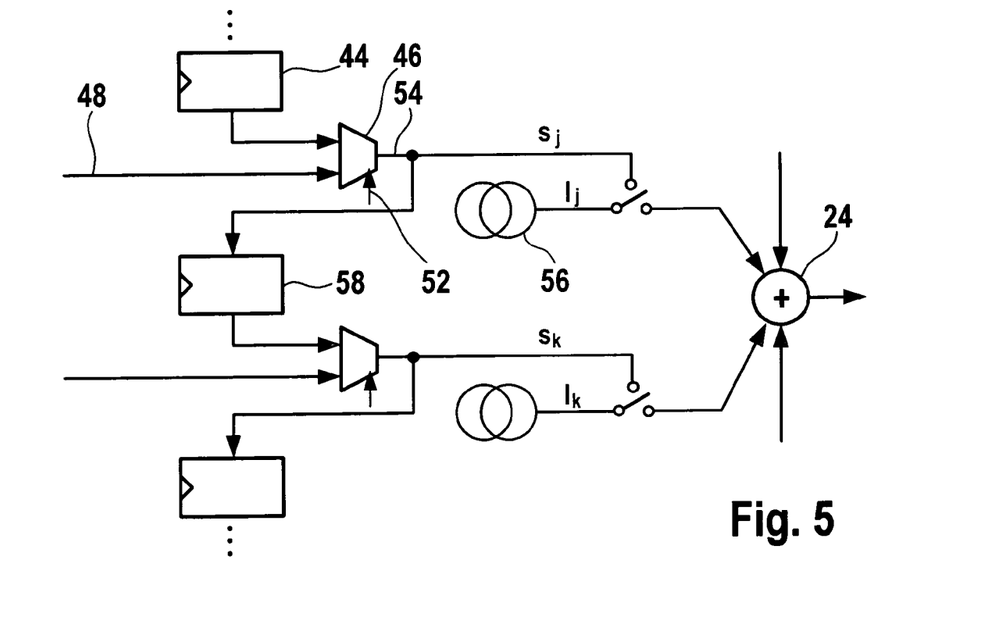
FIG. 5 shows part of the implementation of FIG. 4 in greater details.

FIG. 5 shows part of the implementation of FIG. 4 in greater details. The output of first delay element 44 is fed to an input of switch element 46 having a further external input 48. According to a control signal 52 either the output of first delay element 44 or the external input 48 is connected to the output 54 of switch element 46. The output 54 is used as a control signal for the current source 56, being one of said in total 16 variable current sources 20 of the implementation shown in FIG. 4. The magnitude value $I_j$ is defined by the setting $C_j$ of the respective DAC of the source j. Furthermore, the output 54 is inputted to a second delay element 58. This structure is repeated in total 16 times.

For a maximum filter order of 16, all control signals 52 are such that the output of preceding delay element 44 is connected to the input of the succeeding delay element 58, thus forming a chain of in total 16 delay elements 44, 58. Thus a finite impulse response filter with filter order 16 is formed by the 16 current sources and the corresponding 16 delay elements 44, 58 connected as described above. The filter order can be varied by the control signals 52 which are determined by the setting signal 16h NF concerning filter order. In the shown embodiment, e.g. the chain of 15 delay elements 44, 58 can be broken into 2 sub chains of 7 delay elements each, 4 sub chains of 3 delay elements each, 8 sub chains of 1 delay element each, or 16 sub chains with no delay element.

The inputs 48 of switch elements 46 are enumerated according to a scheme which is shown in FIG. 4 for the case of 16 current sources 56. According to the selected filter order only part of the inputs may be used. E.g. in case of a filter order of 16, only the first input D0 is used. In case of a filter order of 8, the inputs D0 and D1 are used. The FIR filter order can be programmed by breaking into sub-chains. As a rule, for a selected filter order of P, a used input is followed by P−1 unused inputs.

In the case of N equal current sources 56, according to corresponding DAC setting signals $C_k$, the transfer function of the finite impulse response filter becomes a so-called box-car averaging filter providing a running average according to the following equation: $F(z)=I_0(1+z^{-1}+ \ldots +z^{-(N-1)}+z^{-N})$ It is to be understood, that this invention is not limited to the particular component parts of the devices described or to process steps of the methods described as such devices and methods may vary. It is also to be understood, that different features as described in different embodiments, for example illustrated with different Fig., may be combined to new embodiments. It is finally to be understood, that the terminology used herein is for the purposes of describing particular embodiments only and it is not intended to be limiting. It must be noted, that as used in the specification and the appended claims, the singular forms of "a", "an", and "the" include plural referents until the context clearly dictates otherwise. Thus, for example, the reference to "a selection unit" or "a switch element" includes two or more such elements.

It is further to be understood, that this invention is not limited to the particular numerical values of numbers shown, especially this invention is not limited to the particular numerical values of numbers shown for parameters of signals, of component parts, of the devices described, or of process steps of the methods described as such numerical values may vary and the numerical values shown are examples only.

What is claimed is:

1. A method for converting a digital signal to an analog signal, said method using a plurality of signal sources, preferably current sources, one or more of said signal sources being variable output signal magnitude sources, said method comprising:

setting the output signal magnitudes of the one or more variable output signal magnitude sources by one or more individual setting signals being input signals for said respective variable output signal magnitude sources contributing to said analog signal, wherein said converting is adapted on a per signal basis in response to needs concerning bandwidth and/or accuracy for achieving a trade-off between sample-rate and resolution of said conversion, wherein said output signal of said variable output signal magnitude sources are switchable according to a switch control signal provided by a logic unit, thus contributing or not to said analog signal, said switch control signal being derived from said digital signal to be converted, and wherein said logic unit is part of a flexible selection unit, and wherein said digital signal to be converted is an input signal of said flexible selection unit, and operation of said flexible selection unit is software controlled by parameters determining processing of said digital signal to be converted, for achieving a trade-off between sample-rate and resolution of said conversion and hardware filtering effort.

2. The method of claim 1, wherein at least two of said signal sources are variable output signal magnitude sources, an wherein the outputs of said variable output signal magnitude sources are accumulated to contribute to said analog signal.

3. The method of claim 1, wherein said setting signals are digital setting signals, thus said variable output signal magnitude sources being realized as digital-to-analog converters.

4. The method of claim 1, wherein said setting signals being static setting signals independent from said digital signal to be converted.

5. The method of claim 1, wherein said conversion is further adaptable on a per signal basis in response to needs concerning filtering requirements for achieving a trade-off between sample-rate and resolution of said conversion and hardware filtering effort.

6. The method of claim 1, wherein said setting signals are adjustable to compensate mismatches of output signals of said variable output signal magnitude sources.

7. The method of claim 1, wherein said setting signals are equal and said processing of said digital signal to be converted is performed by an over-sampling multi-bit delta-sigma converter according to said operation of said flexible selection unit.

8. The method of claim 1, wherein said setting signals are binary weighted and said processing of said digital signal to be converted is performed by a Nyquist converter according to said operation of said flexible selection unit.

9. The method of claim 1, wherein said variable output signal magnitude sources and said logic unit are part of a finite impulse response filter.

10. The method of claim 9, wherein said filter having a filter characteristic being determined by at least one filter coefficient, and in that values of said filter coefficients are determined by said setting signals of said signal sources.

11. The method of claim 10, wherein said values of said filter coefficients can range from −1 to 1, including at least one intermediate value.

12. A software program or product, preferably stored on a data carrier, for executing the method of claim 1, when run on a data processing system such as a computer.

13. A system for converting a digital signal to an analog signal, said system comprising a plurality of signal sources, preferably current sources, one or more of said signal sources being variable output signal magnitude sources, said system further comprising:

means for setting the output signal magnitudes of the one or more of said variable output signal magnitude sources by individual setting signals being input signals for said respective variable output signal magnitude sources, wherein said converting is adaptable on a per signal basis in response to needs concerning bandwidth and/or accuracy for achieving a trade-off between sample-rate and resolution of said conversion, wherein said output signal of said variable output signal magnitude sources are switchable according to a switch control signal provided by a logic unit, thus contributing or not to said analog signal, said switch control signal being derived from said digital signal to be converted, and wherein said logic unit is part of a flexible selection unit, and wherein said digital signal to be converted is an input signal of said flexible selection unit, and operation of said flexible selection unit is software controlled by parameters determining processing of said digital signal to be converted, e.g. for achieving a trade-off between sample-rate and resolution of said conversion and hardware filtering effort.

14. A method for converting a digital signal to an analog signal comprising:

using a plurality of variable output signal magnitude sources contributing to said analog signal, and setting the output signal magnitudes of each of the variable output signal magnitude sources by a setting signal, the setting signal being individual for each variable output signal magnitude source for individually adjusting the contribution of each variable output signal magnitude source to the analog signal.

15. A system for converting a digital signal to an analog signal, said system comprising a plurality of variable output signal magnitude sources contributing to said analog signal, said system further comprising:

means for setting the output signal magnitudes of each of the variable output signal magnitude sources by a setting signal, the setting signal being individual for each variable output signal magnitude source for individually adjusting the contribution of each variable output signal magnitude source to the analog signal.

* * * * *